US011081354B2

(12) United States Patent
Tseng et al.

(10) Patent No.: US 11,081,354 B2
(45) Date of Patent: *Aug. 3, 2021

(54) FIN PATTERNING METHODS FOR INCREASED PROCESS MARGINS

(71) Applicant: Taiwan Semiconductor Manufacturing Co., Ltd., Hsin-Chu (TW)

(72) Inventors: Chin-Yuan Tseng, Hsinchu (TW); Wei-Liang Lin, Hsin-Chu (TW); Li-Te Lin, Hsinchu (TW); Ru-Gun Liu, Hsinchu County (TW); Min Cao, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/725,731

(22) Filed: Dec. 23, 2019

(65) Prior Publication Data
US 2020/0152464 A1 May 14, 2020

Related U.S. Application Data

(63) Continuation of application No. 15/684,282, filed on Aug. 23, 2017, now Pat. No. 10,535,520.

(60) Provisional application No. 62/491,355, filed on Apr. 28, 2017.

(51) Int. Cl.
*H01L 21/033* (2006.01)
*H01L 21/308* (2006.01)
(Continued)

(52) U.S. Cl.
CPC ...... *H01L 21/0338* (2013.01); *H01L 21/0332* (2013.01); *H01L 21/0335* (2013.01);
(Continued)

(58) Field of Classification Search
None
See application file for complete search history.

(56) References Cited

U.S. PATENT DOCUMENTS 8,728,332 B2    5/2014  Lin et al.
8,796,666 B1    8/2014  Huang et al.
(Continued)

OTHER PUBLICATIONS

U.S. Appl. No. 15/382,035, filed Dec. 16, 2016 by inventors Chin-Yuan Tseng, Wei-Liang Lin, Chin-Yuan Tseng, Wei-Liang Lin, Hsin-Chih Chen, Shi Ning Ju, Ken-Hsien Hsieh, Yung-Sung Yen, Ru-Gun Lin for "Fin-Like Field Effect Transistor Patterning Methods for Increasing Process Margins", 34 pages of text, 20 pages of drawings.

*Primary Examiner* — Stephanie P Duclair
(74) *Attorney, Agent, or Firm* — Haynes and Boone, LLP

(57) ABSTRACT

The present disclosure provides a method in accordance with some embodiments. The method includes forming a mandrel over a substrate, the mandrel having a first sidewall and a second sidewall opposing the first sidewall; forming a first fin on the first sidewall and a second fin on the second sidewall; depositing a dielectric material covering the first fin, the second fin, and the mandrel; partially removing the dielectric material, thereby exposing the second fin; etching the second fin without etching the first fin and the mandrel; removing the dielectric material; and removing the mandrel.

20 Claims, 16 Drawing Sheets

(51) Int. Cl.
  *H01L 21/8234* (2006.01)
  *H01L 21/8238* (2006.01)
  *H01L 29/417* (2006.01)
  *H01L 29/66* (2006.01)

(52) U.S. Cl.
  CPC ...... *H01L 21/0337* (2013.01); *H01L 21/3086* (2013.01); *H01L 21/823431* (2013.01); *H01L 21/823821* (2013.01); *H01L 29/41791* (2013.01); *H01L 29/6656* (2013.01); *H01L 29/66795* (2013.01)

(56) References Cited

U.S. PATENT DOCUMENTS

| | | |
|---|---|---|
| 8,822,243 B2 | 9/2014 | Yan et al. |
| 8,987,142 B2 | 3/2015 | Lee et al. |
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,184,054 B1 | 11/2015 | Huang et al. |
| 9,263,287 B2 | 2/2016 | Tsao et al. |
| 9,337,101 B1 | 5/2016 | Sung et al. |
| 9,397,099 B1 | 7/2016 | Huang |
| 9,501,601 B2 | 11/2016 | Chang et al. |
| 9,548,303 B2 | 1/2017 | Lee et al. |
| 2014/0273464 A1 | 9/2014 | Shieh et al. |
| 2015/0179769 A1* | 6/2015 | He .................. H01L 29/66545 257/632 |
| 2015/0228542 A1 | 8/2015 | Chiu et al. |
| 2016/0079063 A1 | 3/2016 | Lee et al. |
| 2016/0124300 A1 | 5/2016 | Ho et al. |

\* cited by examiner

FIN PATTERNING METHODS FOR INCREASED PROCESS MARGINS

PRIORITY

This is a continuation application of U.S. patent application Ser. No. 15/684,282, filed Aug. 23, 2017, which claims priority of U.S. Prov. Pat. App. Ser. No. 62/491,355 filed Apr. 28, 2017, entitled "Fin Patterning Methods for Increased Process Margins," hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As merely one example, multi-gate devices have been introduced in an effort to improve gate control, reduce OFF-state current, and reduce short-channel effects by increasing gate-channel coupling. One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating short-channel effects. However, continued scaling of FinFET devices requires concurrent improvements in photolithographic processes. Current lithography techniques may be limited, for example, in their alignment precision and repeatability of the equipment used (e.g., a photolithography stepper), as well as in the minimum feature size that may be printed. Thus, current lithography tools may not provide sufficient process margin, in particular when employing existing photolithography processes. As a result, FinFET critical dimensions (CDs) may be directly impacted by pattern misalignment, or other lithography errors, which can result in degraded device performance and/or device failure. Thus, existing techniques have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
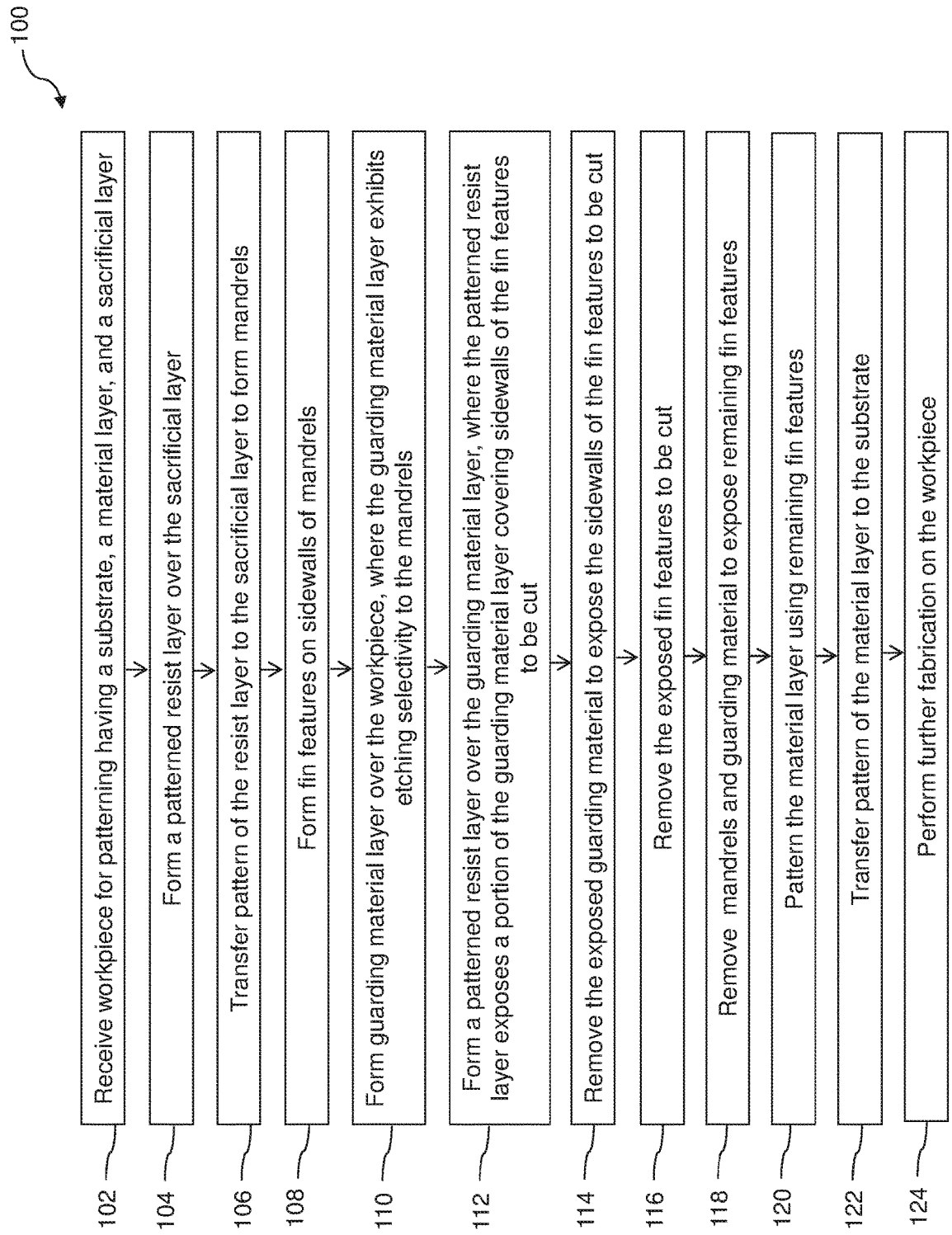
FIG. 1 is a flow chart of a method for fabricating a semiconductor device according to various aspects of the present disclosure.
Figure 2:
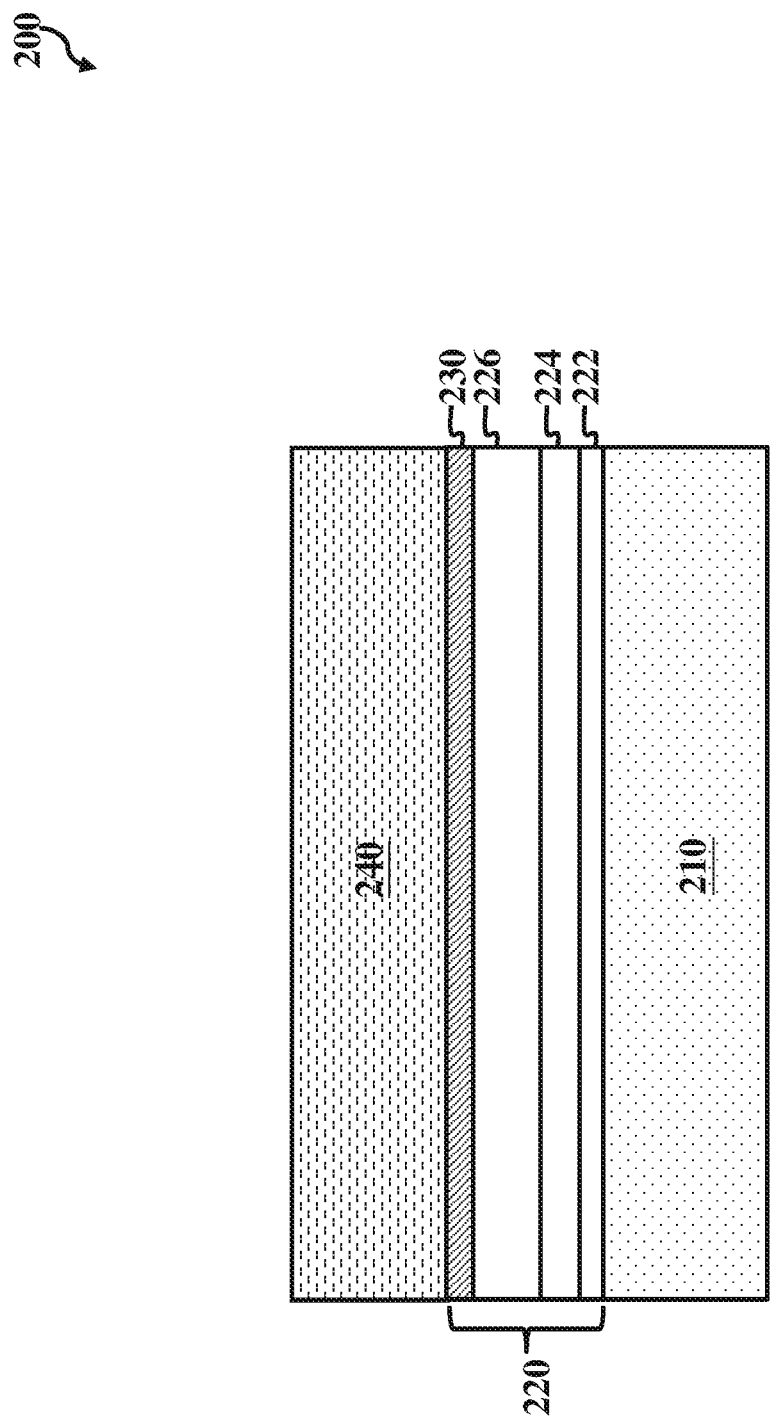
FIGS. 2, 3, 4, 5A, 5B, 6, 7, 8, 9, 10, 11, and 12 are cross-sectional views of a semiconductor device, at various fabrication stages, constructed according to the method in FIG. 1, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure relates generally to IC device manufacturing and, more particularly, to a system and technique for lithographically patterning a workpiece to form a set of features. To pursue even smaller critical dimensions (CD) of device features, multiple lithographic patterning iterations may be performed to define a pattern. Likewise, lithographic patterning of a resist may be supplemented with other techniques, including deposition and etching, to further define the pattern before transferring it to an underlying layer. While such combinations add fabrication steps, they may also provide greater control and enable a wider range of patterns to be formed. Accordingly, despite the added challenge they may pose, novel combinations of patterning techniques and materials have the potential to further enhance CD control, overcome existing CD limitations, and thereby enable even more robust circuit devices to be manufactured.

FIG. 1 is a flow chart of a method 100 for fabricating an integrated circuit (IC) device according to various aspects of the present disclosure. In some implementations, the IC device includes a fin field-effect transistor (FinFET) device, which generally refers to any fin-based transistor device, such as a fin-based, multi-gate transistor. As explained in more detail below, using patterning materials with different etchant selectivity, the method 100 can relax alignment requirements between lithographic processes such as fin-formation and fin-cut. The method 100 is an example, and is not intended to limit the present disclosure beyond what is explicitly recited in the claims. Additional steps can be provided before, during, and after method 100, and some of the steps described can be moved, replaced, or eliminated for additional embodiments of method 100. The method 100 is described below in conjunction with FIGS. 2-12, which illustrate cross-sectional views of a workpiece 200 during various fabrication steps according to an embodiment of the method 100.

The workpiece 200 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

At operation 102, the method 100 (FIG. 1) receives a workpiece 200 (FIG. 2) for patterning. The exemplary workpiece 200 includes a substrate 210 upon which other materials may be formed. One common type of substrate 210 used in integrated circuit (IC) fabrication is a bulk silicon substrate. Accordingly, the workpiece 200 is also referred to as the semiconductor device 200, or the device 200. Additionally or alternatively, the substrate 210 may comprise another elementary (single element) semiconductor, such as germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof. Possible substrates 210 also include a silicon-on-insulator (SOI) substrate. SOI substrates are fabricated using separation by implantation of oxygen (SIMOX), wafer bonding, and/or other suitable methods. In other examples, the substrate 210 may include a multilayer semiconductor structure.

The substrate 210 may include various doped regions (e.g., p-type wells or n-type wells). The doped regions may be doped with p-type dopants, such as phosphorus or arsenic, and/or n-type dopants, such as boron or $BF_2$, depending on design requirements. The doped regions may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques. In some embodiments, the doped regions include halo/pocket regions that can reduce short channel effects (e.g., punch-through effects) and may be formed by tilt-angle ion implantation or other suitable technique.

Various material layers can be formed upon the substrate 210. In the illustrated embodiment, a material layer 220 to be patterned is formed over the substrate 210. The material layer 220 may further include multiple layer structures, such as a tri-layer stack, which includes a bottom layer 222, a middle layer 224, and an upper layer 226. It will be recognized that the substrate 210 may have any number of material layers, masking layers, sacrificial layers, resist layers and/or other layers formed upon it. Suitable materials for these layers may be selected, in part, based on etchant selectivity. For example, in the tri-layer stack, the bottom layer 222, the middle layer 224, and the upper layer 226 may be structured to have different materials, such that each layer can be removed using a corresponding etchant without significant etching of the other layers. In other words, the bottom layer 222, the middle layer 224, and the upper layer 226 include materials having different etch rates. In some implementations, the upper layer 226 can serve as an etch mask for patterning the middle layer 224, the bottom layer 222, and/or the substrate 210; the middle layer 224 can serve as an etch mask for patterning the bottom layer 222 and/or the substrate 210; and the bottom layer 222 can serve as an etch mask for patterning the substrate 210. In some implementations, the bottom layer 222, the middle layer 224, and the upper layer 226 include different semiconductor materials and/or different dielectric materials to achieve desired etching selectivity, such as silicon, amorphous silicon, semiconductor oxide (e.g., silicon oxide ($SiO_2$)), semiconductor nitride (e.g., silicon nitride (SiN)), semiconductor oxynitride (e.g., silicon oxynitride (SiON)), and/or semiconductor carbide (e.g., silicon carbide (SiC)), other semiconductor material, and/or other dielectric material. For example, in some implementations, bottom layer 222 includes silicon oxide, middle layer 224 includes silicon nitride, and upper layer 226 includes silicon oxide. In some implementations, bottom layer 222, middle layer 224, and upper layer 226 include different resist materials to achieve desired etching selectivity. In some implementations, bottom layer 222 and upper layer 226 include organic materials, while middle layer 226 includes inorganic materials. Each layer of the tri-layer stack can be formed by any suitable process, such as chemical vapor deposition (CVD) or a spin-on-glass process. Additionally or optionally, the material layer 220 may have a capping layer 230 on the tri-layer stack.

In furtherance of the illustrated embodiment, a sacrificial layer 240 is formed over the material layer 220. The sacrificial layer 240 includes a different material composition than the material layer 220 (e.g., the capping layer 230). The capping layer 230 is structured to have different etchant sensitivity from the sacrificial layer 240 and other device features to be subsequently formed directly thereon, such that device features directly deposited on the capping layer 230 can be removed using a corresponding etchant without significant etching of the capping layer 230, so as providing protection for rest of the material layer 220. In various embodiments, the sacrificial layer 240 includes a semiconductor and/or a dielectric material, such as a semiconductor oxide, semiconductor nitride, semiconductor oxynitride, and/or other dielectric, while the capping layer 230 includes a different material having etchant selectivity, such as a different semiconductor, semiconductor oxide, semiconductor nitride, semiconductor oxynitride, and or metal oxide. For example, the sacrificial layer 240 includes amorphous silicon and the capping layer 230 includes metal oxide (e.g., aluminum oxide ($AlO_x$) or titanium oxide ($TiO_x$)), as these materials exhibit different etchant sensitivity.

Figure 3:
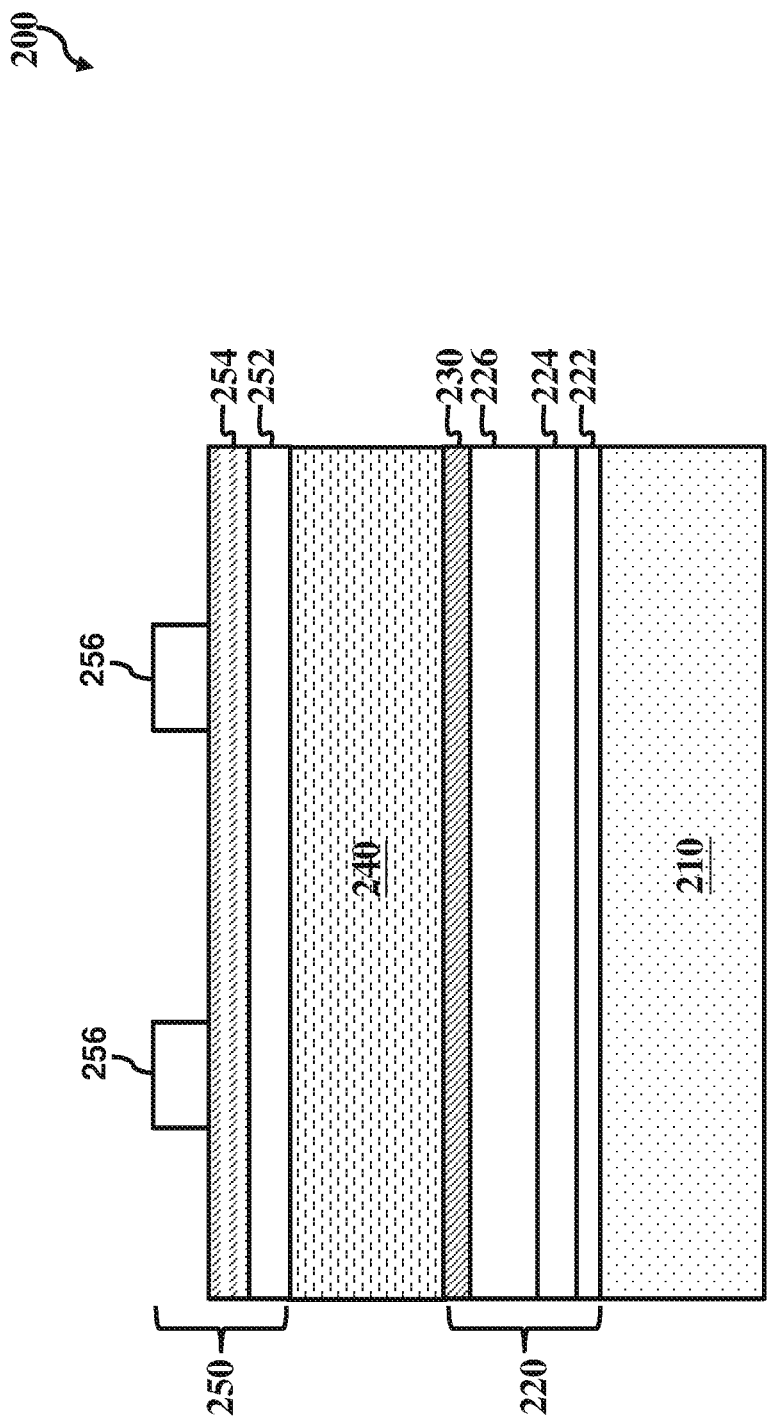

Referring to operation 104 of the method 100 (FIG. 1), a resist layer (e.g., tri-layer photoresist) 250 is formed and subsequently patterned on the sacrificial layer 240 (FIG. 3). Any suitable material or composition may be used in the resist layer 250, and the illustrated tri-layer photoresist is one such example. The exemplary resist layer 250 includes a bottom layer 252, a middle layer 254, and a top layer 256, each with different or at least independent materials. For example, the bottom layer 252 may include a carbon rich polymer material (e.g., $C_xH_yO_z$), the middle layer 254 may include a silicon rich polymer material (e.g., $SiC_xH_yO_z$), and the top layer 256 may include a carbon rich polymer material (e.g., $C_xH_yO_z$) with a photosensitive component that causes the top layer 256 to undergo a property change when exposed to radiation. This property change can be used to selectively remove exposed (in the case of a positive tone resist) or unexposed (in the case of a negative tone resist) portions of the resist layer 250. It is understood that in other embodiments, one or more layers of the tri-layer photoresist may be omitted and that additional layers may be provided as a part of the tri-layer photoresist.

In the illustrated embodiment, the top layer 256 of the resist layer 250 is patterned first. Patterning may be performed using any suitable lithographic technique including photolithography and/or direct-write lithography. An exemplary photolithographic patterning process includes soft baking of the resist layer 250, mask aligning, exposure, post-exposure baking, developing the resist layer 250, rinsing, and drying (e.g., hard baking). An exemplary direct-write patterning process includes scanning the surface of the resist layer 250 with an e-beam or other energy source while varying the intensity of the energy source in order to vary the dosage received by various regions of the resist layer 250. As evident in the following description, the final pattern formed in the material layer 220 is based upon this first pattern, but other intermediate patterning steps alter the pattern before the method 100 is complete.

Figure 4:
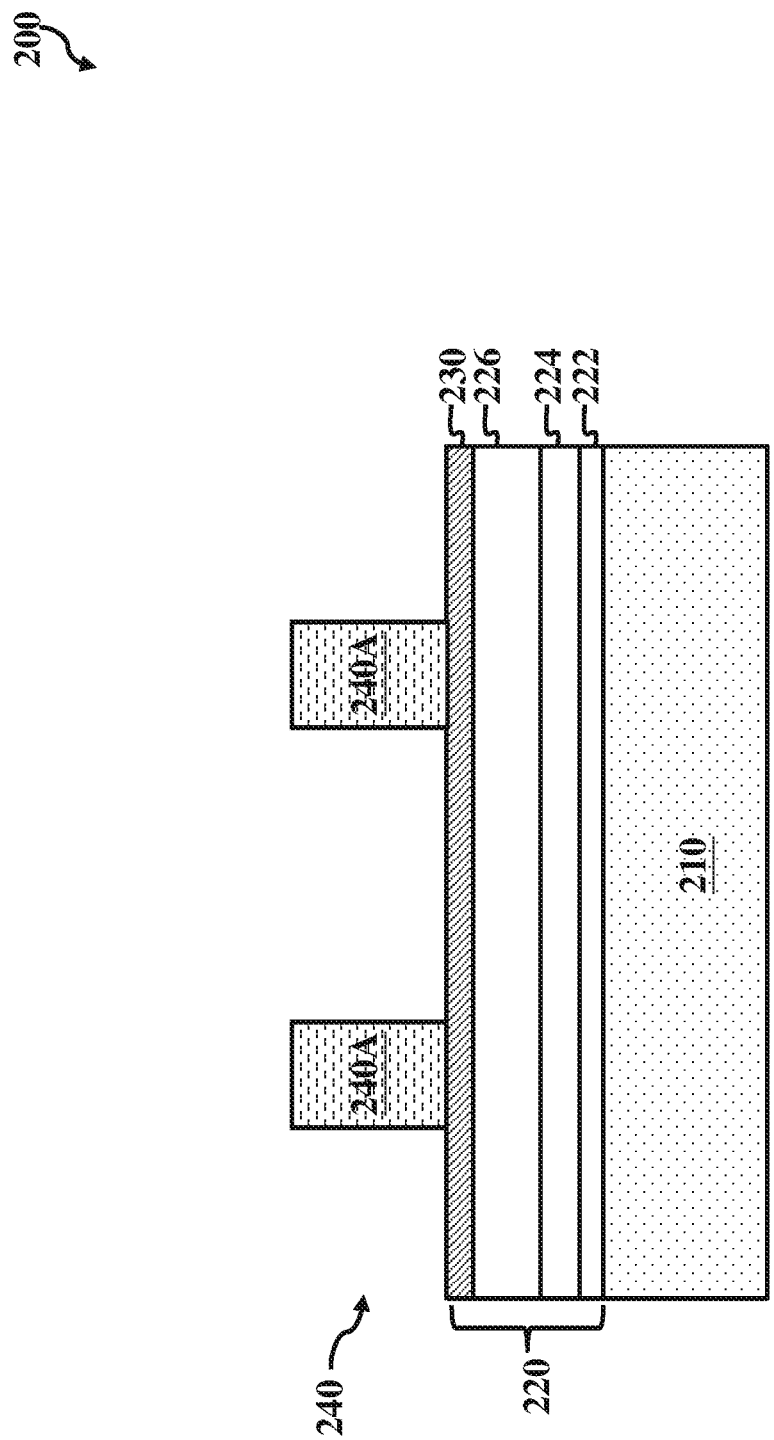

Referring to operation 106 of the method 100 of FIG. 1 and to FIG. 4, the pattern is transferred from the resist layer 250 to the sacrificial layer 240 to form one or more mandrels 240A in the sacrificial layer 240. Mandrels 240A are a feature shape that may be used to align subsequently formed spacers rather than to pattern the material layer 220 directly. The transfer of the pattern to the sacrificial layer 240 may include one or more etching processes to expand the opening formed in the resist layer 250 downward. In this manner, the resist layer 250 (and/or the top layer 256 thereof) is a mask for the etching process. The transfer may include any suitable etching process including wet etching, dry etching, reactive ion etching, ashing, and/or other suitable technique. The etching process and/or etching reagents may be selected to etch the sacrificial layer 240 without significant etching of the material layer 220. Any remaining resist 250 may be stripped following the patterning of the sacrificial layer 240. After the operation 106, the patterned sacrificial layer 240 includes the mandrels 240A.

Figure 5A:
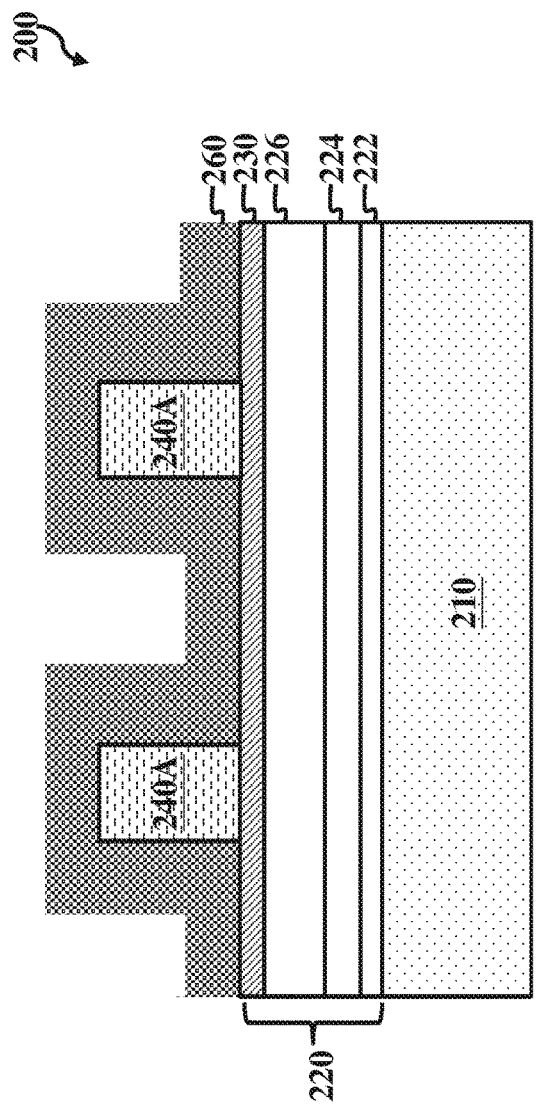
Figure 5B:
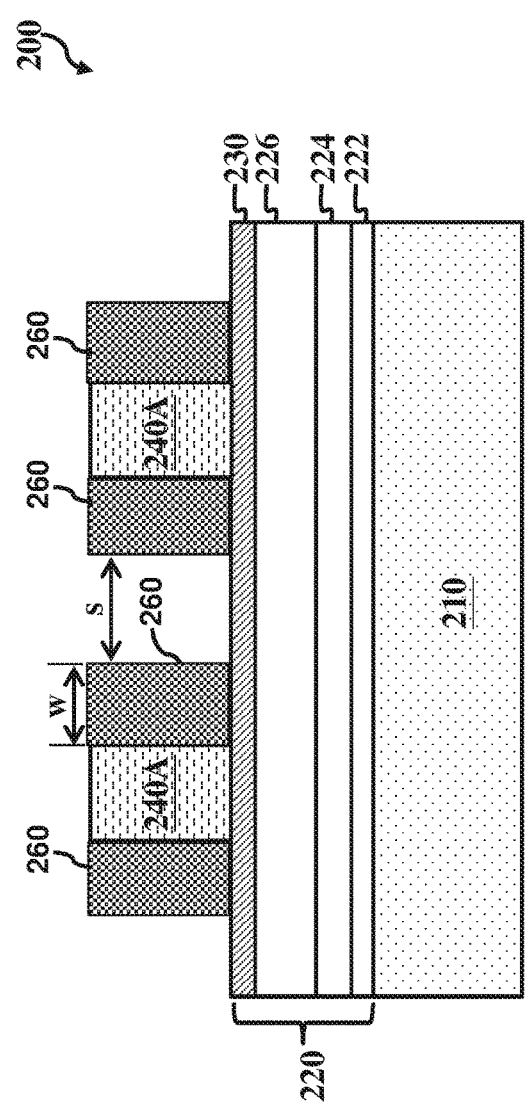

Referring to operation 108 of the method 100 of FIG. 1 and to FIGS. 5A and 5B, spacer structures 260 are formed on sidewalls of the mandrels 240A. A pattern of the spacer structures 260 will be transferred to the substrate 210 to form fins in subsequent operations, therefore the spacer structures 260 may be referred to as fin features 260. The material of the fin features 260 includes any suitable semiconductor, semiconductor oxide, semiconductor nitride, semiconductor oxynitride, other dielectric, and/or other suitable material and is selected to have different etchant sensitivity from the capping layer 230 and the mandrels 240A. For example, in an embodiment where the capping layer 230 includes metal oxide and the mandrels 240A include amorphous silicon, the fin features 260 include silicon nitride.

One technique for forming the fin features 260 on the sidewalls of the mandrels 240A without substantial spacer material remaining on the horizontal surfaces of the device 200 is a deposition and etching process shown in FIGS. 5A and 5B. Referring first to FIG. 5A, in an embodiment, the material of fin features 260 is deposited on the mandrels 240A and on the material layer 220 by any suitable process including atomic layer deposition (ALD), chemical vapor deposition (CVD), plasma-enhanced CVD (PECVD), or other suitable deposition techniques. Conformal deposition techniques may be used, despite depositing material on the horizontal surfaces as shown in FIG. 5A. To remove this extraneous material, an anisotropic etching such as a dry or plasma etching, may be performed to etch back and remove those portions of the material of fin features 260 deposited on the horizontal surfaces of the mandrels 240A and the material layer 220 as shown in FIG. 5B. In this way, only those portions of the spacers deposited on the sidewall surfaces of the mandrels 240A remain. In various examples, the deposition thickness and the etching technique are tuned to control a width (W) of the fin features 260, where adjacent fin features 260 are separated by a space (S). The fin features 260 have a pitch P, where pitch generally refers to a sum of a width of an IC feature (such as W) and a width of a space adjacent to the IC feature (such as S between fin features 260) (in other words, P=W+S). In some implementations, the pitch P is a minimum pitch achievable between fin features 260 by a lithography process for a given technology node. The width W of these fin features 260 is correlated to the thickness of the features to be formed in the material layer 220, and, in many embodiments, deposition and etching can be manipulated for more precise control of feature thickness than can be achieved by lithography alone. In some embodiments, the width W is in a range from about 8 nm to about 15 nm and the space S is in a range from about 8 nm to about 15 nm.

Figure 6:
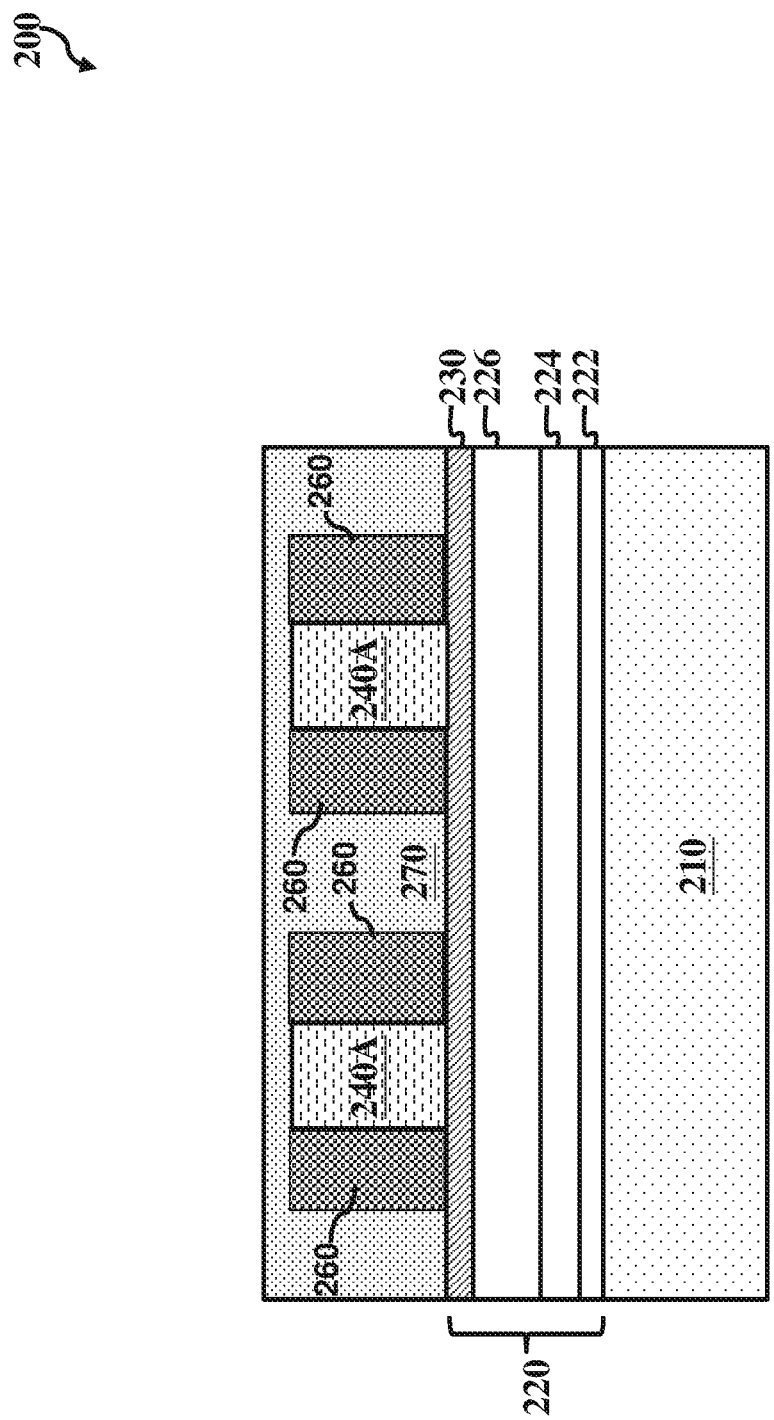

Referring to operation 110 of the method 100 of FIG. 1 and to FIG. 6, a guarding material layer 270 is formed in spaces defined by the fin features 260 and the mandrels 240A. In the depicted embodiment, the guarding material layer 270 is also deposited over the fin features 260 and the mandrels 240A, covering the fin features 260 and the mandrels 240A. The guarding material layer 270 may include any suitable semiconductor, semiconductor oxide, semiconductor nitride, semiconductor oxynitride, and/or other suitable material and is selected to have different etchant sensitivity than the fin features 260, the mandrels 240A, and the capping layer 230, such that the guarding material layer 270 can be removed using a corresponding etchant without significant etching of the fin features 260, the mandrels 240A, and the capping layer 230, and vice versa. In other words, the guarding material layer 270, the fin features 260, the mandrels 240A, and the capping layer 230 each include materials having different etchant sensitivities. For example, in an embodiment where the capping layer 230 includes metal oxide, mandrels 240A include amorphous silicon, fin features 260 include silicon nitride, and the guarding material layer 270 includes silicon oxide. If the top layer 226 of the material layer 220 includes material that exhibits different etch rates from the guarding material layer 270, the fin features 260, and the mandrels 240A, then the capping layer 230 is optional and can be omitted, such that the top layer 226 may directly interface with the guarding material layer 270, the fin features 260, and the mandrels 240A. The deposition of the guarding material layer 270 can include ALD, CVD, PECVD, high density plasma CVD (HDPCVD), metal organic CVD (MOCVD), remote plasma CVD (RPCVD), low-pressure CVD (LPCVD), atomic layer CVD (ALCVD), atmospheric pressure CVD (APCVD), physical vapor deposition (PVD), spin coating, plating, other deposition methods, or combinations thereof. Following the deposition of the guarding material layer 270, a chemical-mechanical polishing/planarization (CMP) process may be performed to planarize a top surface of the device 200.

Figure 7:
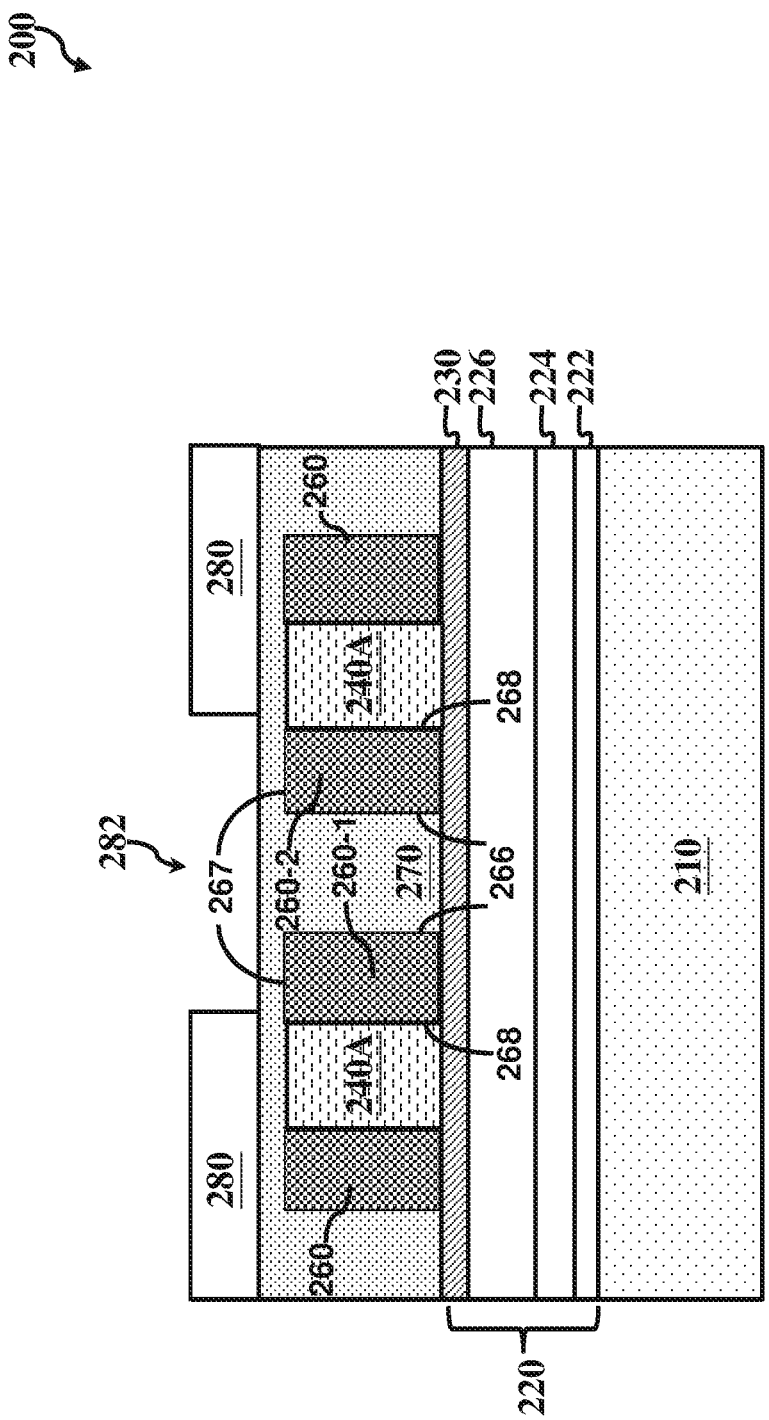
Figure 8:
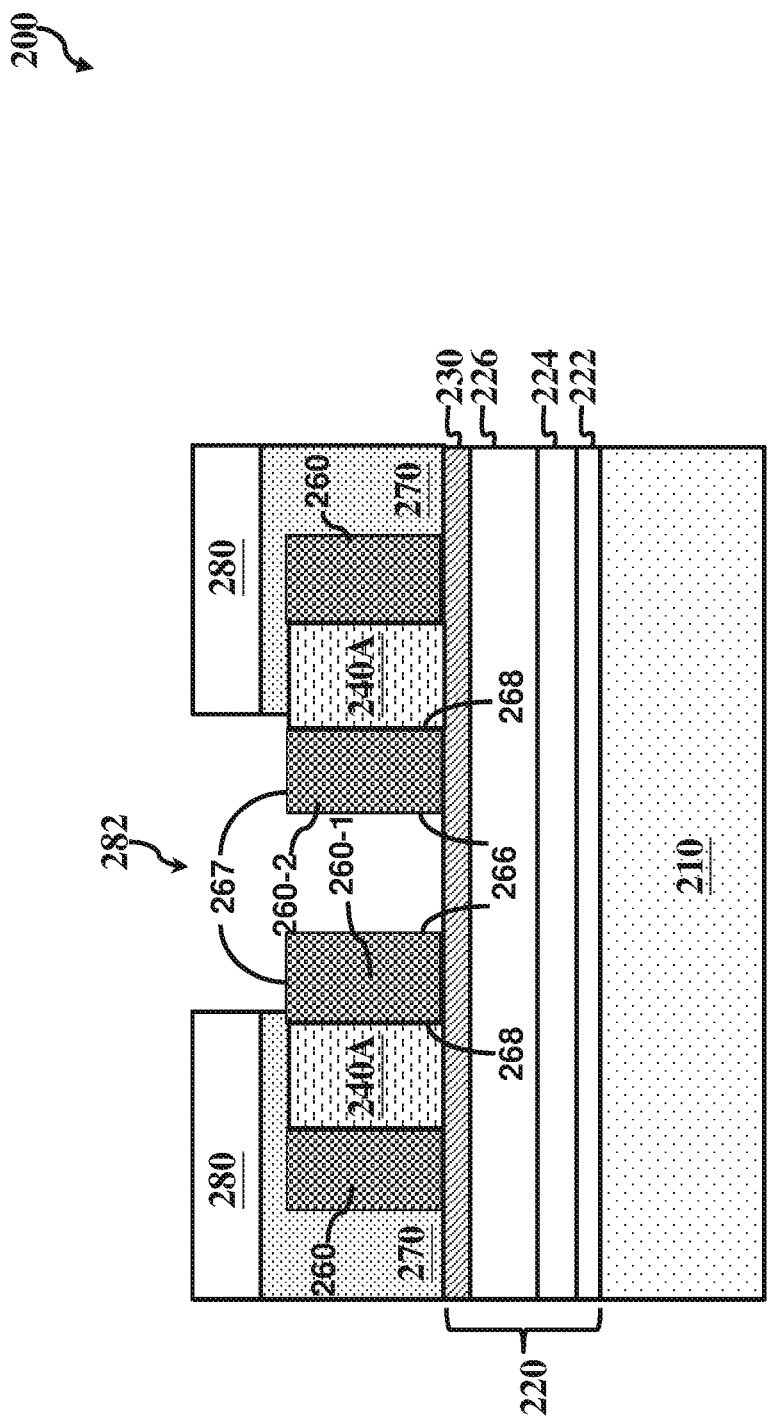

At operation 112, the method 100 (FIG. 1) forms a patterned mask layer 280 (or resist layer 280) over guarding material layer 270 (FIG. 7). For example, the patterned mask layer 280 can be a hard mask layer or a photoresist layer. In an example, the patterned mask layer 280 is a tri-layer photoresist layer, having layer structured similar to the resist layer 250 depicted in FIG. 3. In an embodiment, a lithography process forms the patterned mask layer 280. The lithography process can include forming a resist layer on guarding material layer 270 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type, such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. Alternatively, the lithography process can be implemented or replaced by other methods, such as maskless lithography, e-beam writing, ion-beam writing, and/or nanoimprint technology. After development, the patterned mask layer 280 includes a cut pattern that corresponds with the mask pattern, where the cut pattern defines an opening 282 overlapping (unmasking) a subset of the fin features 260, thereby defining a group of unprotected (unwanted) fin features (e.g. fin features 260-1 and 260-2) from the other protected (wanted) fin features 260. Unprotected fin features are to be removed during the fin cut process, which will be described in further details.

In the depicted embodiment, each unprotected fin features 260-1 or 260-2 include a top surface 267 defined between a sidewall 266 covered by the guarding material layer 270 and a sidewall 268 covered by the mandrels 240A, where the guarding material layer 270 and the mandrels 240A exhibit etching selectivity due to different material compositions. The patterned resist layer 280 unmasks sidewalls 266, thereby exposing a portion of the guarding material layer 270 that covers the sidewalls 266. In some implementations, the opening 282 partially unmasks top surfaces 267 of unprotected fins (e.g., top surface 267 of the unprotected fin 260-1), leaving the sidewall 268 stilled masked. In some implementations, the opening 282 fully unmasks top surfaces 267 of unprotected fins (e.g., top surface 267 of the unprotected fin 260-2), thereby unmasking both the sidewalls 266 and 268 of the unprotected fins. Further, in the depicted embodiment, two unprotected fin features 260-1 and 260-2 are unmasked in the opening 282, while the present disclosure contemplates embodiments where the subset of the fin features 260 can include any number of unprotected fins. For example, the subset of fin features 260 unmasked by the cut pattern can include a single unprotected fin, where the cut pattern unmasks a portion (such as at least one sidewall 266) of the single unprotected fin. In another example, the subset of fins 232 unmasked by the cut pattern can include more than two unprotected fins, where the cut pattern partially unmasks unprotected fin near a perimeter of the cut pattern (for example, by unmasking at least one sidewall 266) and fully unmasking unprotected mandrels disposed between unprotected mandrels near the perimeter (for example, by unmasking top surfaces 267 and sidewalls 266 and 268 defining unprotected fins).

At operation 114, the method 100 (FIG. 1) transfers the cut pattern in the patterned resist layer 280 to the guarding material layer 270 (FIG. 8), thereby forming patterned guarding material layer 270 that partially exposes unprotected fins, such as fin features 260-1 and 260-2 in the depicted embodiment. In some embodiments, an etching process removes the guarding material layer 270 exposed by the opening 282 defined in patterned resist layer 280, such as the guarding material layer 270 covering top surfaces 267 and sidewalls 266 of unprotected fin features 260-1 and 260-2. The etching process also expands the opening 282 downward. Some mandrels 240A covering sidewalls 268 may be covered by the patterned guarding material layer 270 and avoid exposing in the opening 282 (e.g. mandrel 240 covering sidewall 268 of the fin 260-1) or some mandrels 240A may have a portion exposed in the opening 282 (e.g., mandrel 240 covering sidewall 268 of the fin 260-2). In some embodiments, a portion of the top surface of the capping layer 230 is exposed in the opening 282. The etching process is a dry etching process, a wet etching process, or combinations thereof. In the depicted embodiment, the guarding material layer 270 is selectively etched from portions of unprotected fin features 260-1 and 260-2 without etching (or without significantly etching) unprotected fin features 260-1 and 260-2, mandrel 240, and the capping layer 230 due to different etchant sensitivity of each feature. Various etching parameters can be tuned to selectively etch the guarding material layer 270, such as etchant composition, etching temperature, etching solution concentration, etching time, etching pressure, source power, RF bias voltage, RF bias power, etchant flow rate, other suitable etching parameters, or combinations thereof. In some implementations, a wet etching process can selectively etch guarding material layer 270 using a suitable etching solution, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. After the operation 114, the mandrels 240A substantially remain on the sidewalls 268.

Figure 9:
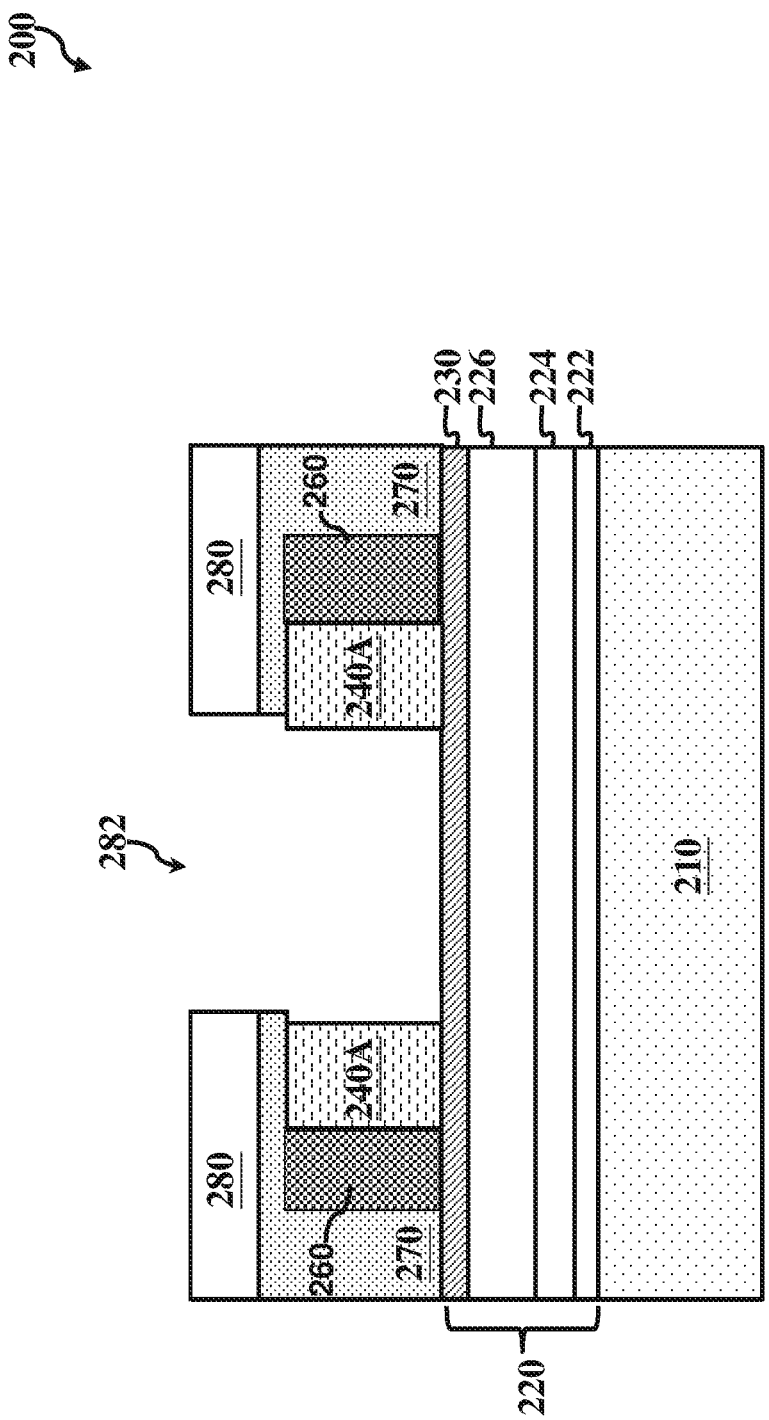
Figure 10:
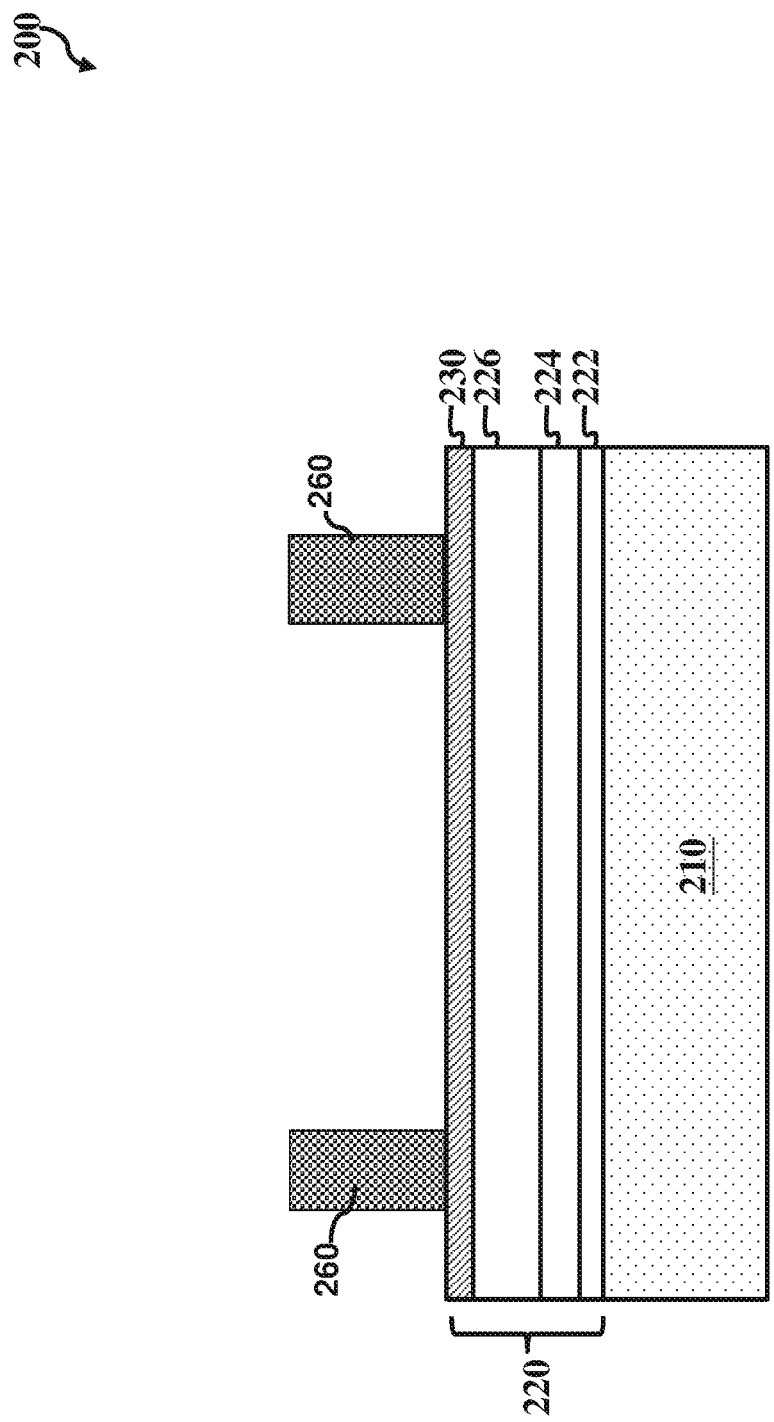

At operation 116, the method 100 (FIG. 1) removes unprotected fin features (e.g., fin features 260-1 and 260-2) exposed in the opening 282 (FIG. 9). For example, an etching process is performed to remove unprotected fin features 260-1 and 260-2. Unprotected fin features 260-1 and 260-2 are selectively etched without etching (or without significantly etching) the patterned guarding material layer 270, the mandrels 240A, and the material layer 220 (in particular, the capping layer 230). The etching process is a dry etching process, a wet etching process, or combinations thereof. Various etching parameters can be tuned to selectively etch unprotected fins, such as etchant composition, etching temperature, etching solution concentration, etching time, etching pressure, source power, RF bias voltage, RF bias power, etchant flow rate, other suitable etching parameters, or combinations thereof. In some implementations, a wet etching process can selectively etch unprotected fins using a suitable etching solution, such as an HF based solution, an $H_2SO_4$ based solution, an HCl acid based solution, an $NH_4OH$ based solution, other suitable etching solution, or combinations thereof. Thereafter, patterned mask layer 280 can be removed, for example, by a stripping process.

At operation 118, the method 100 (FIG. 1) removes any remaining guarding material layer 270 and the mandrels 240A (FIG. 10), for example, by a selective etching process as described above with reference to FIG. 8, leaving fin features 260 disposed over the material layer 220. With unprotected fin features removed, the fin features 260 are separated by a space larger than S, such that fin features 260 have a pitch larger than P.

Figure 11:
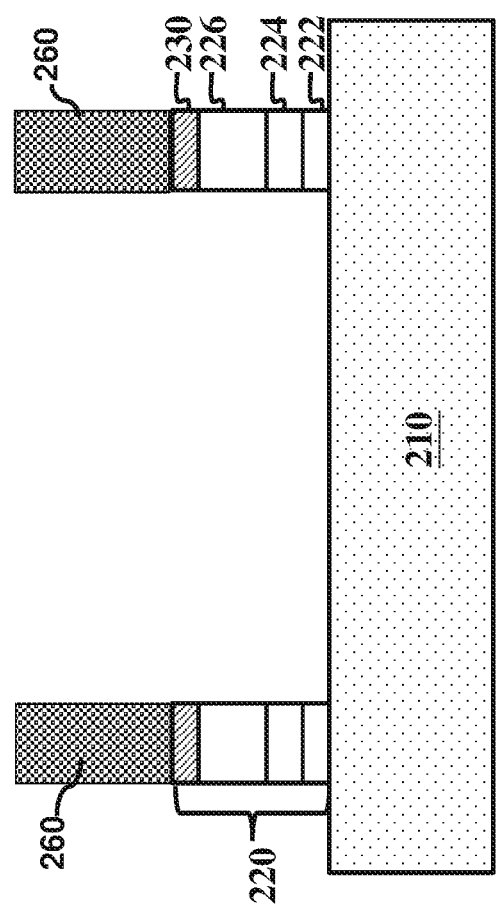

At operation 120, the method 100 (FIG. 1) patterns the material layer 220 using the remaining portions of the fin 260 as a hard mask (FIG. 11). Patterning the material layer 220 may include any suitable etching technique, such as wet etching, dry etching, reactive ion etching, ashing, and/or other suitable technique. In this way, the final pattern is formed on the material layer 220. Afterwards, any remaining portions of the fin 260 may be removed.

Figure 12:
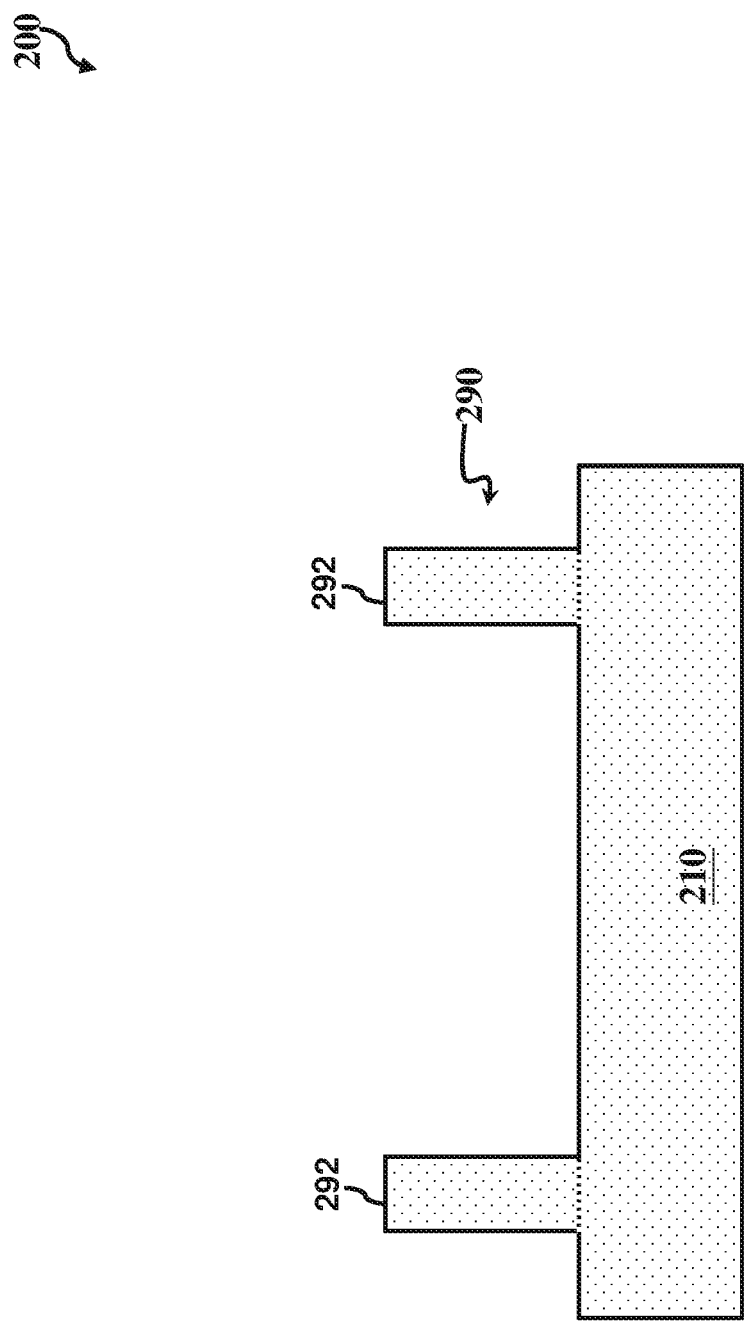

At operation 122, the method 100 (FIG. 1) patterns the substrate 210 using the patterned material layer 220 as a mask (FIG. 12). Portions of the substrate 210 are removed to form a fin layer 290, for example, by an etching process. The fin layer 290 includes an array of fins 292 corresponding to the pattern of the fin features 260. The etching process is a dry etching process, a wet etching process, or combinations thereof. In some implementations, the patterned material layer 220 can be removed after forming the fin layer 290.

After patterning the substrate 210, the device 200 may be provided for further fabrication processes at operation 124 of the method 100 (FIG. 1). The patterned substrate 210 may be used in conjunction with any etching process, deposition process, implantation process, epitaxy process, and/or any other fabrication process. For example, an isolation feature(s) may be formed between the fins 292, thereby isolation various active regions of the device 200. The isolation feature includes silicon oxide, silicon nitride, silicon oxynitride, other suitable isolation material, or combinations thereof. The isolation feature can include different structures, such as STI structures, deep trench isolation (DTI) structures, and/or local oxidation of silicon (LOCOS) structures. In some implementations, the isolation feature is formed by filling space between the fins 292 with insulator material (e.g., by using a chemical vapor deposition process or a spin-on glass process). A CMP process may be performed to remove excessive insulator material and/or planarize a top surface of the isolation feature. In some implementations, the isolation feature is formed by depositing an insulator material over substrate 210, such that the insulator material layer fills space between fins 292, and etching back the insulator material layer. In some implementations, the isolation feature includes a multi-layer structure, such as a silicon nitride layer disposed over a thermal oxide liner layer. Subsequent processing may include one or more ion implantation processes (e.g., into fins 292), may include formation of one or more epitaxially-grown layers (which may include doped layers), and may include formation of gate structures (e.g., high-K/metal gate stacks). In addition, subsequent processing may include formation of sidewall spacers (for example, on the high-K/metal gate stacks), source/drain features (e.g., epitaxially grown source/drain features), etch stop layer(s), interlayer dielectric (ILD) layer(s), contact openings, contact metal, as well as various contacts/vias/lines and multilayers interconnect features (for example, metal layers and interlayer dielectrics) over substrate 210, configured to connect the various features to form a functional circuit, which may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Because the method 100 partially exposes the subset of fin features to be removed, instead of conventionally fully exposing the subset of fin features to be removed, the method 100 is considered as a partial open pattern etching (POPE) process. Further, because the method 100 employs at least two different materials with etchant selectivity on sidewalls of the subset of fin features and selectively etches each separately, the method 100 may be referred to as a separated material partial open pattern etch (S-POPE) process. As described further below, method 100 can increase patterning process windows, such as overlay process windows, increase fin-cut symmetry, ease IC manufacturability, and/or increase IC design layout flexibility.

Figure 13A:
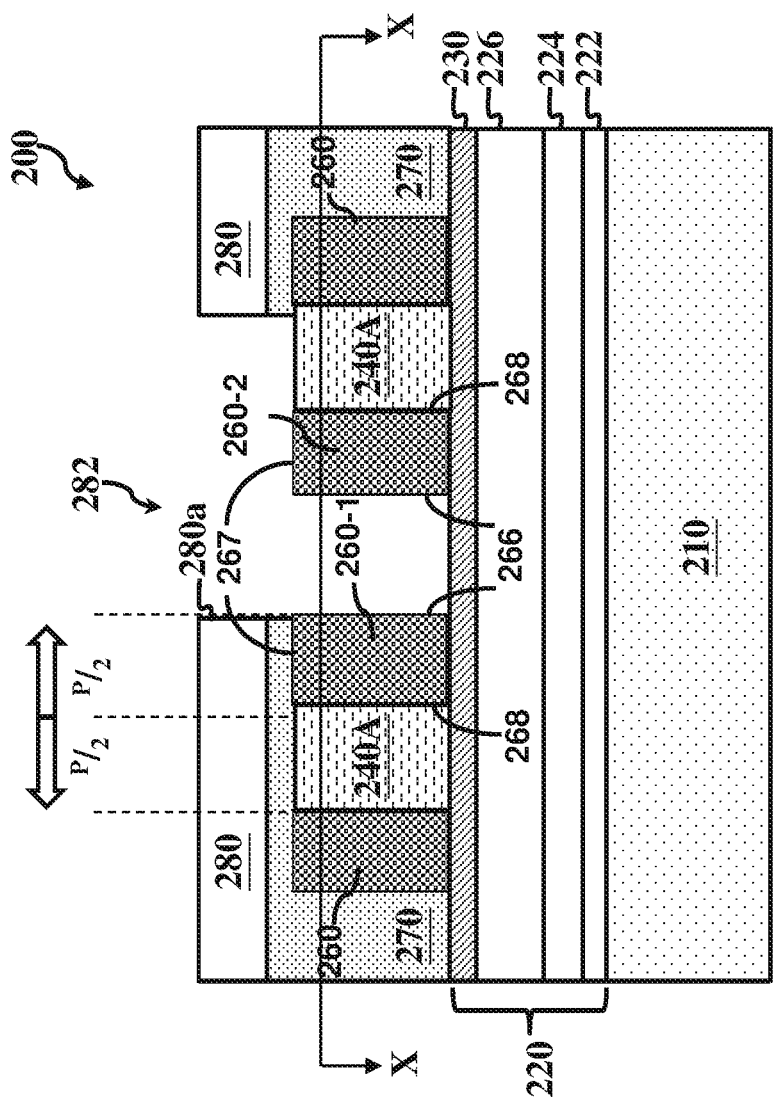
FIGS. 13A, 13B, 13C, 14A, 14B, and 14C are cross-sectional and top views of a semiconductor device, at various fabrication stages, constructed according to the method in FIG. 1, in accordance with some other embodiments.
Figure 13C:
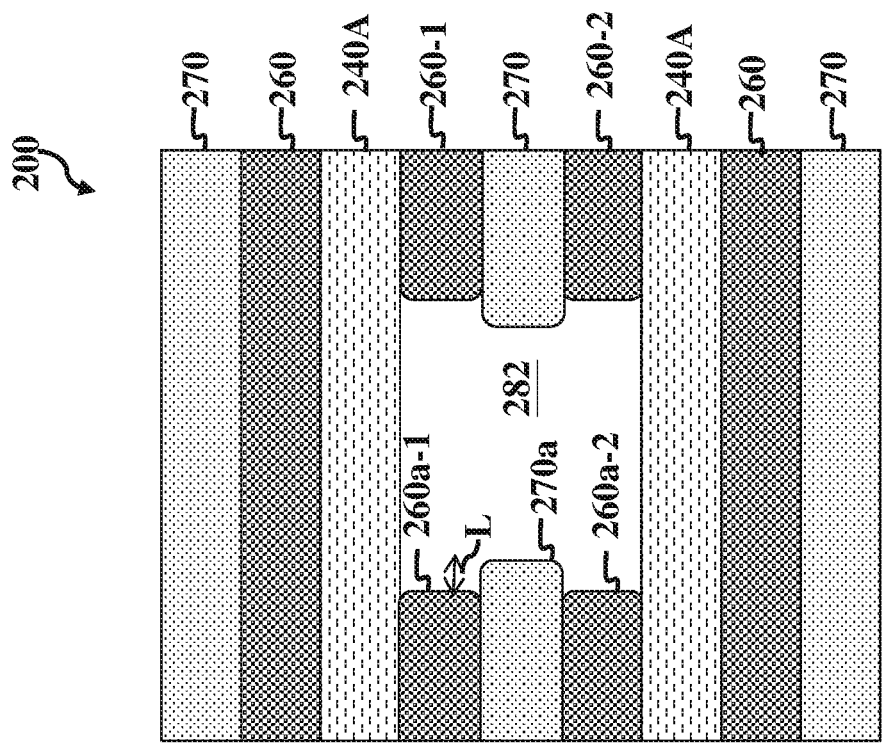
Figure 13B:
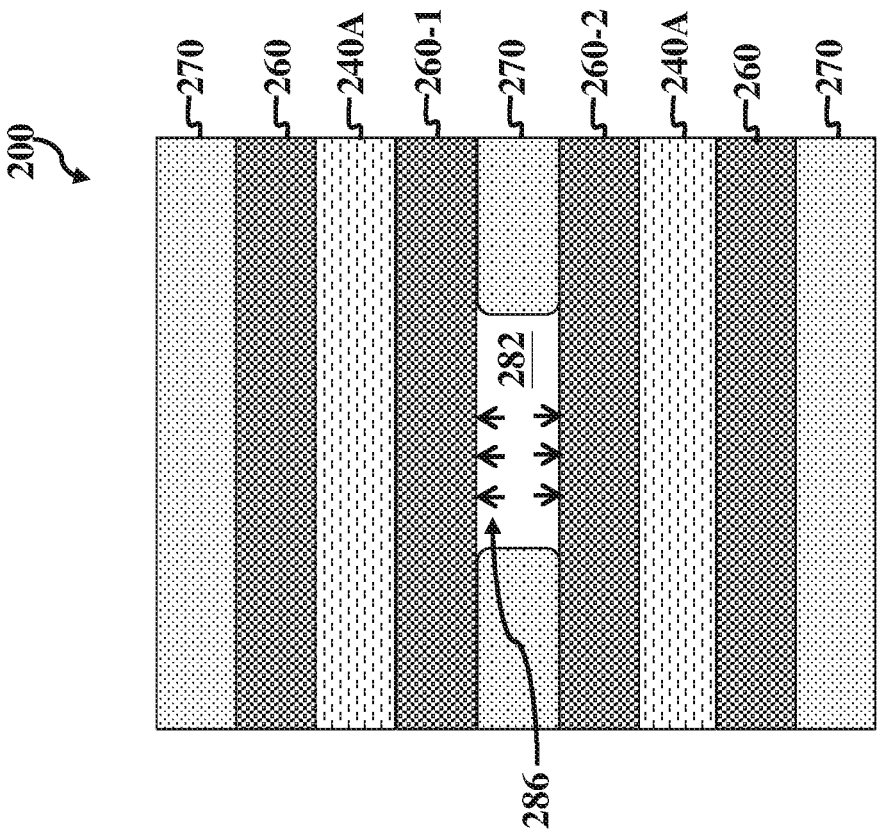

FIG. 13A illustrates cross-sectional view of a device 200 at operation 114 of the method 100 (FIG. 1) in one embodiment. An overlay misalignment causes the patterned resist layer 280 to shift more towards one fin, such as the fin 260-2 as depicted. The cut pattern exposes the sidewalls 266 of the fin features 260-1 and 260-2 and the top surface 267 of the fin 260-2, but only partially exposes the top surface 267 of the fin 260-1. The S-POPE process allows partially exposed fins to be removed. Referring to FIG. 13B, a top view of the device 200 along the "X-X" line of FIG. 13A is shown. Despite the overlay misalignment between the patterned resist layer 280 and the device 200, both fin features 260-1 and 260-2 have one sidewall covered by the mandrels 240A and another sidewall exposed to the opening 282 allowing the etchant to be applied thereon, thereby still providing a symmetric etching environment. When an etchant 286 is applied into the opening 282, sidewalls facing the opening 282 from different fins to be removed are under the etching process symmetrically. FIG. 13C shows the device 200 at operation 116 of the method 100 (FIG. 1). A portion of the fin features 260-1 and 260-2 has been removed based on the cut pattern. Cut edges 260a-1 and 260a-2 of the unprotected fins may recess from the edge of the patterned guarding material layer 270 a distance L due to lateral etching, depending on the etching processes applied and etchants selected. The edges 260a-1 and 260a-2 are substantially aligned due to the symmetric etching environment for the fin features 260-1 and 260-2. Referring back to FIG. 13A, the S-POPE process can increase the overlay (cut) budget from S/2 in conventional fin cutting processes to P/2, such that edge 280a of the patterned resist layer 280 can shift a distance P/2, in either direction, still allowing the unprotected fins to be removed. In some implementations, the S-POPE processes can provide a 40% to 50% increase in overlay (cut) margins.

Figure 14A:
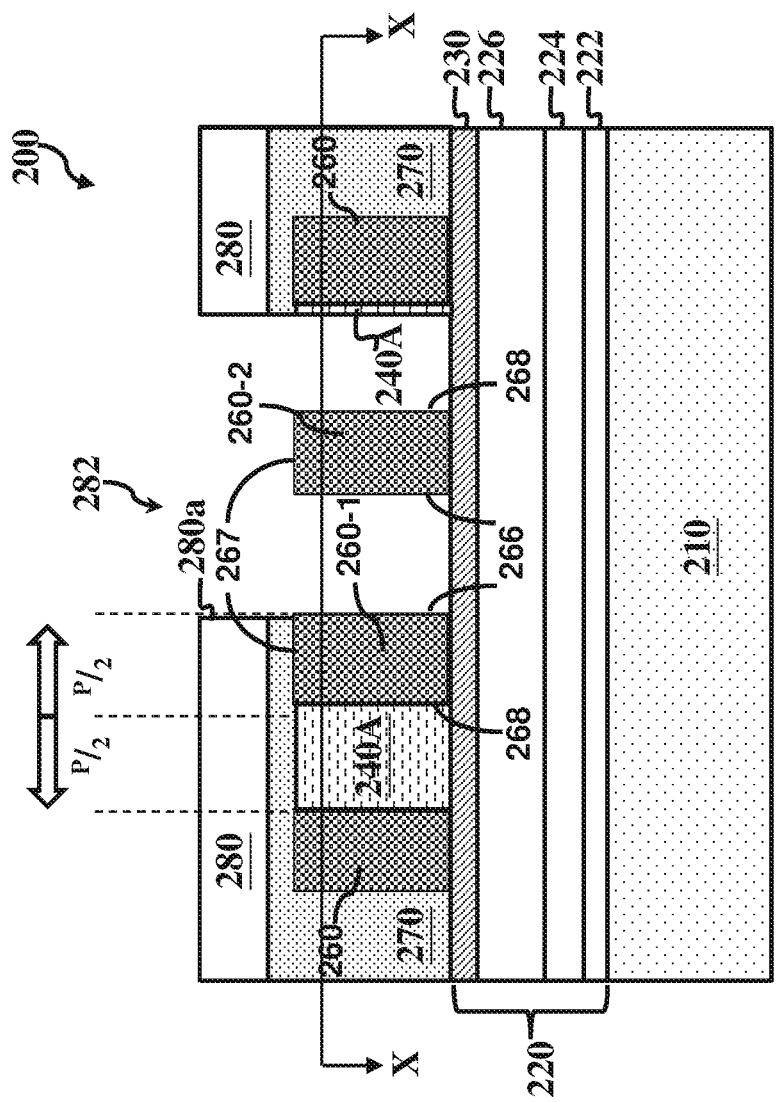
Figure 14C:
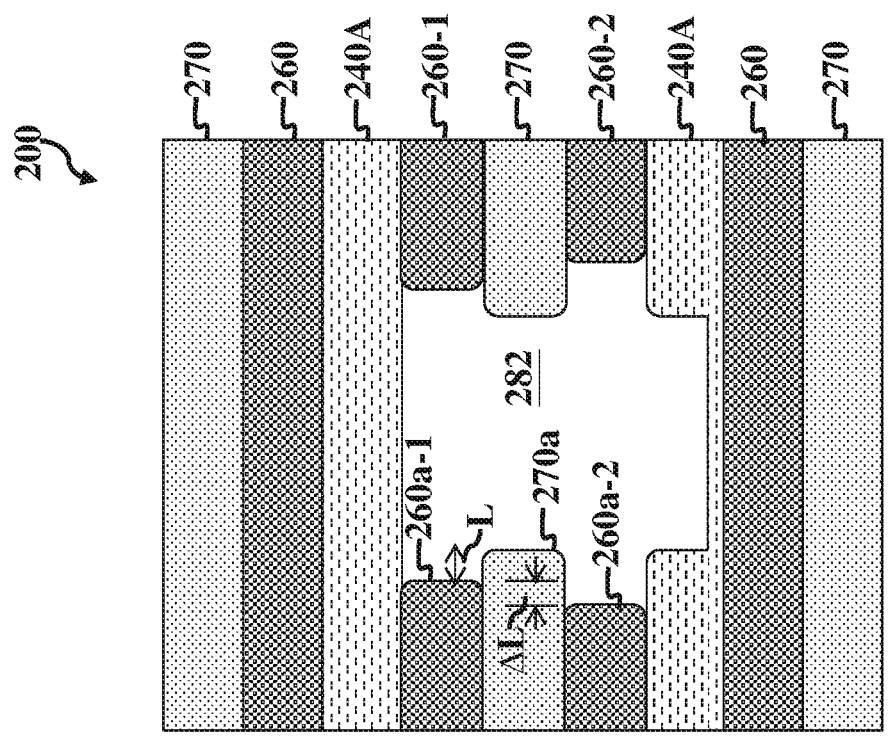
Figure 14B:
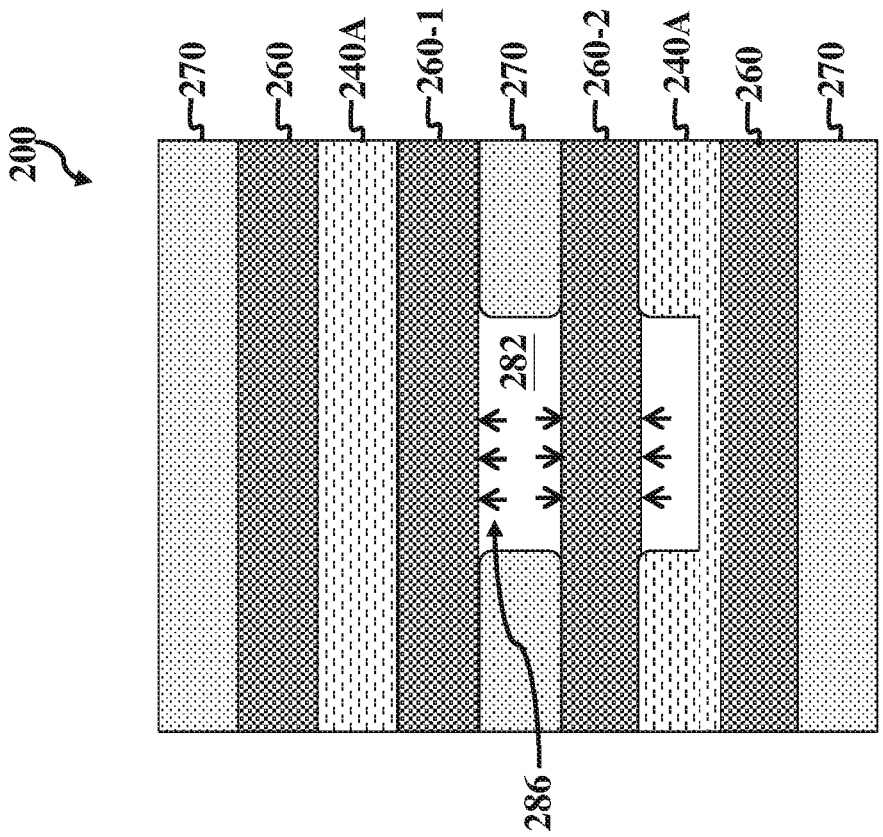

It is desirable for the mandrels 240A and the guarding material layer 270 to include different material to exhibit certain etchant selectivity, allowing sidewall materials to be removed by separate etching steps in the S-POPE process. As a comparison, FIG. 14A shows a device 200 at operation 114 of the method 100 (FIG. 1) in another embodiment. The device 200 in FIG. 14A is similar to FIG. 13A, while the mandrels 240A and the guarding material layer 270 are the same material. An overlay misalignment causes the patterned resist layer 280 to shift more towards one fin, such as the fin 260-2 as depicted. Since the mandrel 240 covering the sidewall 268 of the fin 260-2 is partially exposed in the opening 282, the etching of the guarding material layer 270 will together remove a portion of the mandrels 240A exposed in the opening 282. Therefore, the process is not considered as an S-POPE process, but still as a POPE process. Both sidewalls of the fin 260-2 are exposed after the etching, while only one sidewall of the fin 260-1 is exposed. Referring to FIG. 14B, a top view of the device 200 along the "X-X" line of FIG. 14A is shown. Compared with FIG. 13A, the fin features 260-1 and 260-2 are in an asymmetric etching environment. The fin 260-1 has one sidewall covered by the mandrels 240A and one sidewall exposed to the opening 282. The fin 260-2 has both sidewalls exposed to the opening 282. When an etchant 286 is applied into the opening 282, the etchant etches the fin 260-1 from one side only and etches the fin 260-2 from both sides. As a result, as shown in FIG. 14C, the etching of the fin 260-2 is more efficient than the fin 260-1, and the cut edge 260a-2 may suffer from extra lateral recess from the edge 270a than the cut edge 260a-1, denoted by ΔL in FIG. 14C. The cut pattern of the fin features 260-1 and 260-2 becomes asymmetric. Compared to S-POPE process depicted in FIG. 13C, S-POPE process provides improved line end-to-end control ability.

Although not intended to be limiting, one or more embodiments of the present disclosure provide many benefits to a semiconductor device and the formation thereof, such as increasing patterning process windows (e.g., overlay process windows), improving line end-to-end control, easing IC manufacturability, and/or increasing IC design layout flexibility. The present disclosure illustrates FinFET devices that can be fabricated according to various embodiments of method 100. Method 100 can be applied to fin cut last process as well, where fins have been formed in the substrate 210 first and two different materials are then deposited on each sidewall of the fins to be removed, respectively. Though method 100 is applied herein to form fins of FinFET devices, method 100 can be applied in numerous ways to form other IC features of IC devices. As one of many examples, S-POPE processes disclosed herein can be implemented to form gate features and/or other IC features where larger patterning process windows are desired for easing manufacturability and/or increasing IC design layout flexibility. Such POPE processes would involve exposing a subset of gate features (or other IC features) using a cut pattern, where the cut pattern partially exposes at least one gate feature (or other IC feature) of the subset of gate features, and removing the exposed subset of gate features (or other IC features).

In one exemplary aspect, the present disclosure is directed to a method. The method includes forming a material layer that includes an array of fin features, wherein at least one fin feature has a first material on a first sidewall and a second material on a second sidewall that is opposite to the first sidewall, wherein the first material is different from the second material; exposing the second sidewall of the at least one fin feature; and removing the at least one fin feature. In an embodiment, the exposing the second sidewall includes removing a portion of the second material, while the first material remains on the first sidewall. In an embodiment, the exposing the second sidewall further includes forming a patterned mask layer over the material layer, the patterned mask layer having an opening defined therein that at least partially overlaps the at least one fin feature; and removing the portion of the second material exposed in the opening. In an embodiment, the opening overlaps a portion of the first material on the first sidewall of the at least one fin feature.

In an embodiment, the removing the portion of the second material includes selectively etching the second material. In an embodiment, the removing the at least one fin feature includes selectively etching the at least one fin feature. In an embodiment, the second material covers the array of fin features and the first material. In an embodiment, the forming the material layer includes forming an array of mandrels over a substrate, wherein the array of mandrels comprises the first material; forming the array of fin features on sidewalls of the array of mandrels; and depositing the second dielectric material to fill spaces between the array of fin features. In an embodiment, the array of fin features includes silicon nitride; the array of mandrels includes amorphous silicon; and the second material includes silicon oxide.

In another exemplary aspect, the present disclosure is directed to a method. The method includes forming a plurality of mandrels over the substrate; forming a plurality of fin features on sidewalls of the plurality of mandrels; depositing a guarding material layer over the plurality of fin features, wherein the guarding material layer has a different etchant sensitivity from the plurality of mandrels; removing a portion of the guarding material layer to partially expose a fin feature of the plurality of fins; and removing the partially exposed fin feature. In an embodiment, the depositing of the guarding material layer includes depositing the guarding material layer on sidewalls of the plurality of fin features. In an embodiment, the partially exposing the fin feature includes removing the guarding material layer from a first sidewall of the fin feature, while a second sidewall of the fin feature remains in physical contact with the plurality of mandrels. In an embodiment, the removing the portion of the guarding material layer includes selectively etching the guarding material layer. In an embodiment, the removing the portion of the guarding material layer further includes forming a patterned mask layer over the guarding material layer, the patterned mask layer having an opening defined therein that partially overlaps the fin feature, and further wherein the portion of the guarding material layer is selectively etched within the opening. In an embodiment, the removing the partially exposed fin feature includes selectively etching the partially exposed fin feature. In an embodiment, the method further includes transferring to the substrate a pattern using the plurality of fin features as a mask after the removing the partially exposed fin feature.

In another exemplary aspect, the present disclosure is directed to a method. The method includes forming a sacrificial layer over a substrate; patterning the sacrificial layer to form a set of mandrels; depositing spacers on sidewalls of the set of mandrels; depositing a guarding material between the spacers, wherein the guarding material exhibits etching selectivity to the set of mandrels; performing a first etching process to remove a portion of the guarding material, thereby exposing sidewalls of a subset of the spacers; performing a second etching process to remove the subset of the spacers; and performing a third etching process to remove the set of mandrels. In an embodiment, the performing the first etching process includes forming a patterned resist layer on the guarding material with an opening defined therein, the opening overlying the portion of the guarding material that is interspersed between the subset of the set of spacers. In an embodiment, the first etching process is configured to substantially avoid removing a portion of the set of mandrels. In an embodiment, the guarding material covers the set of mandrels and the spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a mandrel over a substrate, the mandrel having a first sidewall and a second sidewall opposing the first sidewall;
    forming a first fin on the first sidewall and a second fin on the second sidewall;
    depositing a dielectric material covering the first fin, the second fin, and the mandrel;
    partially removing the dielectric material, thereby exposing the second fin, wherein a portion of a top surface of the second fin remains covered by the dielectric material;
    etching the second fin without etching the first fin and the mandrel;
    removing the dielectric material; and
    removing the mandrel.

2. The method of claim 1, further comprising:
    etching the substrate by using the first fin as an etch mask.

3. The method of claim 1, wherein the partially removing of the dielectric material also exposing a top surface of the substrate.

4. The method of claim 1, wherein after the depositing of the dielectric material, the dielectric material physically contacts the first fin, the second fin, and the mandrel.

5. The method of claim 4, wherein after the depositing of the dielectric material, the dielectric material physically contacts a top surface of the substrate.

6. The method of claim 1, wherein the partially removing of the dielectric material includes forming a patterned hard mask over the dielectric material, the patterned hard mask having an opening defined therein that at least partially overlaps the second fin from a top view, and wherein the dielectric material is selectively etched through the opening.

7. The method of claim 1, wherein:
    the first and second fins include silicon nitride;
    the mandrel includes amorphous silicon; and
    the dielectric material includes silicon oxide.

8. The method of claim 1, wherein the etching of the second fin includes selectively etching the second fin without substantially etching the dielectric material.

9. The method of claim 1, wherein the first and second fins include a nitride and the dielectric material includes an oxide.

10. A method, comprising:
    forming a first mandrel and a second mandrel on a substrate;
    forming a first fin and a second fin between the first and second mandrels, wherein the first fin is in physical contact with the first mandrel and the second fin is in physical contact with the second mandrel;
    depositing a dielectric material between the first and second fins, the dielectric material also covers top surfaces of the first and second mandrels;
    removing a portion of the dielectric material to form an opening, thereby exposing the first and second fins;
    removing the first and second fins through the opening; and
    removing the dielectric material and the first and second mandrels.

11. The method of claim 10, wherein the first fin is spaced from the second fin.

12. The method of claim 10, wherein the dielectric material physically contacts a top surface of the substrate.

13. The method of claim 10, wherein the depositing of the dielectric material includes depositing the dielectric material on opposing sidewalls of the first and second fins.

14. The method of claim 10, wherein the opening fully exposes a top surface of the second fin and partially exposes a top surface of the first fin.

15. The method of claim 14, wherein the opening also partially exposes the second mandrel, while the first mandrel remains fully covered by the dielectric material.

16. The method of claim 10, wherein the removing of the first and second fins through the opening includes selectively etching the first and second fins without substantially etching the dielectric material and the first and second mandrels.

17. A method, comprising:
    forming a sacrificial layer over a substrate;
    patterning the sacrificial layer to form a plurality of mandrels;
    depositing spacers on sidewalls of each of the plurality of mandrels;
    depositing a guarding material covering and in physical contact with the spacers and the plurality of mandrels, wherein the guarding material exhibits etching selectivity to both the spacers and the plurality of mandrels;
    performing a first etching process to form an opening in the guarding material, thereby exposing a subset of the spacers;
    performing a second etching process through the opening to remove each spacer in the subset; and
    performing a third etching process to remove the plurality of mandrels.

18. The method of claim 17, wherein a number of the spacers in the subset is two.

19. The method of claim 17, wherein the opening partially exposes a top surface of at least one spacer in the subset.

20. The method of claim 17, wherein the opening partially exposes a top surface of the substrate.

* * * * *